United States Patent
Ogawa

(10) Patent No.: US 9,246,180 B2
(45) Date of Patent: Jan. 26, 2016

(54) FUEL CELL MODULE

(71) Applicant: Tetsuya Ogawa, Wako (JP)

(72) Inventor: Tetsuya Ogawa, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 106 days.

(21) Appl. No.: 14/241,726

(22) PCT Filed: Oct. 2, 2012

(86) PCT No.: PCT/JP2012/076058
§ 371 (c)(1),
(2) Date: Feb. 27, 2014

(87) PCT Pub. No.: WO2013/058135
PCT Pub. Date: Apr. 25, 2013

(65) Prior Publication Data
US 2014/0205866 A1   Jul. 24, 2014

(30) Foreign Application Priority Data

Oct. 19, 2011   (JP) ................... 2011-229925

(51) Int. Cl.
| H01M 8/04 | (2006.01) |
| H01M 8/06 | (2006.01) |
| H01M 8/12 | (2006.01) |
| H01M 8/24 | (2006.01) |
| H01L 35/30 | (2006.01) |

(52) U.S. Cl.
CPC ........... *H01M 8/04007* (2013.01); *H01L 35/30* (2013.01); *H01M 8/04067* (2013.01); *H01M 8/04738* (2013.01); *H01M 8/0618* (2013.01); *H01M 8/1206* (2013.01); *H01M 8/2425* (2013.01); *H01M 8/04074* (2013.01); *Y02E 60/521* (2013.01); *Y02E 60/525* (2013.01)

(58) Field of Classification Search
None
See application file for complete search history.

(56) References Cited

U.S. PATENT DOCUMENTS

| 6,770,106 B1 | 8/2004 | Okamoto et al. |
| 2004/0038095 A1 | 2/2004 | Kushibiki et al. |

(Continued)

FOREIGN PATENT DOCUMENTS

| EP | 1 962 362 | 8/2008 |
| JP | 4-280484 | 10/1992 |

(Continued)

OTHER PUBLICATIONS

Japanese Office Action dated Aug. 19, 2014, Application No. 2011-229925; partial English translation included.

(Continued)

*Primary Examiner* — Patrick Ryan
*Assistant Examiner* — Carmen Lyles-Irving
(74) *Attorney, Agent, or Firm* — Rankin, Hill & Clark LLP

(57) ABSTRACT

A fuel cell module includes a fuel cell stack, a reformer for reforming a mixed gas of a raw fuel and water vapor, an evaporator for supplying water vapor to the reformer, and a heat exchanger for raising the temperature of the oxygen-containing gas by heat exchange with a combustion gas, and an exhaust gas combustor and a start-up combustor for producing the combustion gas. The fuel cell module includes a first thermoelectric converter and a second thermoelectric converter for performing thermoelectric conversion based on a temperature difference between the combustion gas and the oxygen-containing gas.

11 Claims, 13 Drawing Sheets

(56) References Cited

U.S. PATENT DOCUMENTS

| | | |
|---|---|---|
| 2005/0089731 A1 | 4/2005 | Ogiwara et al. |
| 2005/0164051 A1 | 7/2005 | Venkataraman et al. |
| 2006/0107594 A1 | 5/2006 | Kuwaba |
| 2008/0008646 A1 | 1/2008 | Kaye |
| 2009/0263689 A1 | 10/2009 | Homma |
| 2011/0048484 A1 | 3/2011 | Gao et al. |
| 2011/0250513 A1 | 10/2011 | Akikusa |

FOREIGN PATENT DOCUMENTS

| | | |
|---|---|---|
| JP | 6-103994 | 4/1994 |
| JP | 2000-251914 | 9/2000 |
| JP | 2003-086223 | 3/2003 |
| JP | 2003-229151 | 8/2003 |
| JP | 2004-087169 | 3/2004 |
| JP | 2004-319363 | 11/2004 |
| JP | 2005-166439 | 6/2005 |
| JP | 2006-143564 | 6/2006 |
| JP | 2007-042437 | 2/2007 |
| JP | 2007-311160 | 11/2007 |
| JP | 2008-218277 | 9/2008 |
| JP | 2008-251362 | 10/2008 |
| JP | 2010-218888 | 9/2010 |
| WO | 01/47800 | 7/2001 |
| WO | 2009/028169 | 3/2009 |

OTHER PUBLICATIONS

Japanese Office Action dated Sep. 24, 2014, Application No. 2011-229933; partial English translation included.

This application is co-pending with U.S. Appl. No. 14/241,734, filed Feb. 27, 2014.

FUEL CELL MODULE

TECHNICAL FIELD

The present invention relates to a fuel cell module including a fuel cell stack for generating electricity by electrochemical reactions of a fuel gas and an oxygen-containing gas.

BACKGROUND ART

Typically, a solid oxide fuel cell (SOFC) employs a solid electrolyte of ion-conductive oxide such as stabilized zirconia. The electrolyte is interposed between an anode and a cathode to form an electrolyte electrode assembly (MEA). The electrolyte electrode assembly is interposed between separators (bipolar plates). In use, generally, predetermined numbers of the electrolyte electrode assemblies and the separators are stacked together to form a fuel cell stack.

As a system including the fuel cell stack, for example, a fuel cell system disclosed in Japanese Laid-Open Patent Publication No. 2005-166439 (hereinafter referred to as the conventional technique 1) is known. As shown in FIG. 13, the fuel cell system uses a solid oxide fuel cell 4 having a solid electrolyte 1, a fuel electrode 2 on one side of the solid electrolyte 1, and an air electrode 3 on the other side of the solid electrolyte 1. The air is supplied to the air electrode 3 as the oxygen-containing gas, and the fuel gas is supplied to the fuel electrode 2 for generating electricity by reaction of the fuel gas and the air.

In the fuel cell system, additionally, a start-up combustor 5, an exhaust gas combustor 6, and a heat exchanger 7 are provided. At the time of starting operation of the fuel cell system, the start-up combustor 5 reforms or imperfectly combusts the fuel gas supplied from the outside to supply the fuel gas to the fuel electrode 2 as a reducing gas. The exhaust gas combustor 6 combusts the off gas discharged form the fuel electrode 2. The heat exchanger 7 heats the air by the heat generated in the exhaust gas combustor 6.

According to the disclosure, in the structure, the large amount of unconsumed exhaust gas such as carbon monoxide produced in the fuel cell system at the time of starting operation of the fuel cell system can be reduced as much as possible, generation of heat stress due to the temperature difference can be prevented by heating both of the fuel electrode 2 and the air electrode 3, and improvement in the durability of the fuel cell system is achieved. Further, both of the fuel electrode 2 and the air electrode 3 can be heated at the same time efficiently, and the time required for starting operation of the fuel cell system is reduced.

SUMMARY OF INVENTION

In the conventional technique 1, the heat produced in the exhaust gas combustor 6 is supplied to the heat exchanger 7 to heat the air, and then, the heat is emitted to the outside. However, the heat emitted from the heat exchanger 7 has a considerably high temperature, and the heat energy is discharged wastefully. Further, due to the emission of the heat at the high temperature from the heat exchanger 7, problems of waste heat occur disadvantageously.

The present invention has been made to solve the problems of this type, and an object of the present invention is to provide a fuel cell module which makes it possible to suppress heat energy losses suitably, facilitate thermally self-sustaining operation, and improve power generation efficiency.

The present invention relates to a fuel cell module including a fuel cell stack for generating electricity by electrochemical reactions of a fuel gas and an oxygen-containing gas, a reformer for reforming a mixed gas of water vapor and a raw fuel chiefly containing hydrocarbon to produce the fuel gas, and supplying the fuel gas to the fuel cell stack, an evaporator for evaporating water, and supplying water vapor to the reformer, a heat exchanger for raising a temperature of the oxygen-containing gas by heat exchange with a combustion gas, and supplying the oxygen-containing gas to the fuel cell stack, an exhaust gas combustor for combusting the fuel gas discharged from the fuel cell stack as a fuel exhaust gas and the oxygen-containing gas discharged from the fuel cell stack as an oxygen-containing exhaust gas to produce the combustion gas, and a start-up combustor for combusting the raw fuel and the oxygen-containing gas to produce the combustion gas.

The fuel cell module includes a thermoelectric converter for performing thermoelectric conversion based on a temperature difference between the combustion gas and the oxygen-containing gas.

In the present invention, the temperature difference between the combustion gas and the oxygen-containing gas, i.e., the heat energy can be collected as electrical energy. In particular, it becomes possible to improve the power generation efficiency without any losses in the start-up time. Further, since the temperature of the combustion gas is decreased, generation of waste heat is suppressed. Moreover, since the temperature of the oxygen-containing gas is increased, thermally self-sustaining operation is facilitated.

The combustion gas herein is a gas generated by the exhaust gas combustor and the start-up combustor. The combustion gas is a heating medium which can provide heat by performing heat exchange with a fluid to be heated (e.g., another gas). After heat energy is released from the combustion gas, the combustion gas is referred to as the exhaust gas.

Further, thermally self-sustaining operation herein means operation where the entire amount of heat quantity required for operating the fuel cell system is supplied within the fuel cell system, and where the operating temperature of the fuel cell system is maintained using only heat energy generated in the fuel cell system, without supplying additional heat from the outside.

DESCRIPTION OF EMBODIMENTS

Figure 1:
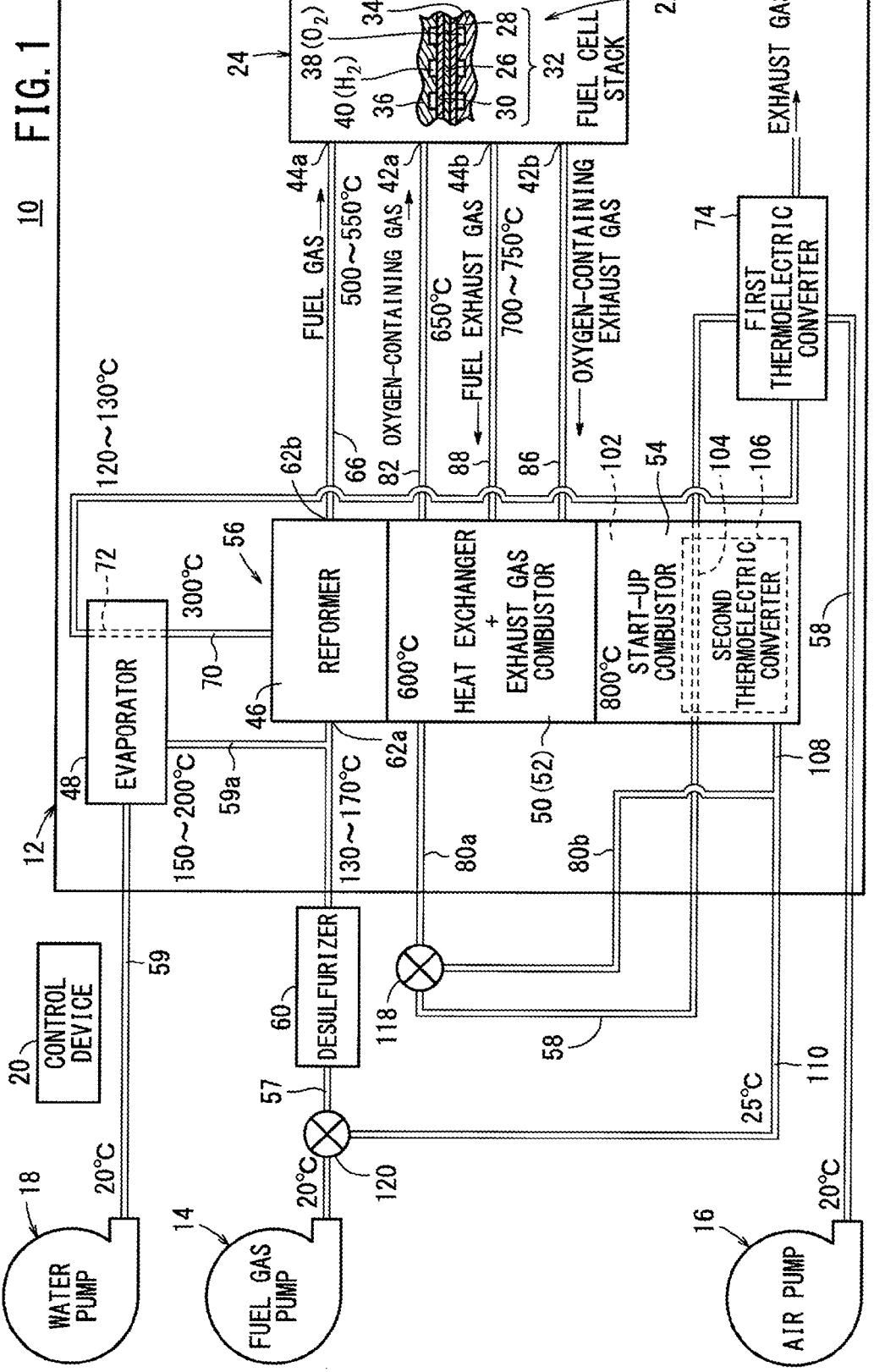
FIG. 1 is a diagram schematically showing a structure of a fuel cell system including a fuel cell module according to a first embodiment of the present invention.

A fuel cell system 10 shown in FIG. 1 includes a fuel cell module 12 according to a first embodiment of the present invention, and the fuel cell system 10 is used in various applications, including stationary and mobile applications. For example, the fuel cell system 10 is mounted on a vehicle.

The fuel cell system 10 includes the fuel cell module (SOFC module) 12 for generating electrical energy in power generation by electrochemical reactions of a fuel gas (e.g., a gas produced by mixing a hydrogen gas, methane, and carbon monoxide) and an oxygen-containing gas (air), a raw fuel supply apparatus (including a fuel gas pump) 14 for supplying a raw fuel (e.g., city gas) chiefly containing hydrocarbon to the fuel cell module 12, an oxygen-containing gas supply apparatus (including an air pump) 16 for supplying the oxygen-containing gas to the fuel cell module 12, a water supply apparatus (including a water pump) 18 for supplying water to the fuel cell module 12, and a control device 20 for controlling the amount of electrical energy generated in the fuel cell module 12.

The fuel cell module 12 includes a fuel cell stack 24 formed by stacking a plurality of solid oxide fuel cells 22 in a vertical direction (or in a horizontal direction). For example, the fuel cell 22 includes an electrolyte electrode assembly 32 (MEA). The electrolyte electrode assembly 32 includes a cathode 28, an anode 30, and an electrolyte 26 interposed between the cathode 28 and the anode 30. For example, the electrolyte 26 is made of ion-conductive oxide such as stabilized zirconia.

A cathode side separator 34 and an anode side separator 36 are provided on both sides of the electrolyte electrode assembly 32. An oxygen-containing gas flow field 38 for supplying an oxygen-containing gas to the cathode 28 is formed in the cathode side separator 34, and a fuel gas flow field 40 for supplying a fuel gas to the anode 30 is formed in the anode side separator 36. As the fuel cell 22, various types of conventional SOFC can be adopted.

An oxygen-containing gas supply passage 42a, an oxygen-containing gas discharge passage 42b, a fuel gas supply passage 44a, and a fuel gas discharge passage 44b extend through the fuel cell stack 24. The oxygen-containing gas supply passage 42a is connected to an inlet of each oxygen-containing gas flow field 38, the oxygen-containing gas discharge passage 42b is connected to an outlet of each oxygen-containing gas flow field 38, the fuel gas supply passage 44a is connected to an inlet of each fuel gas flow field 40, and the fuel gas discharge passage 44b is connected to an outlet of each fuel gas flow field 40.

The fuel cell module 12 includes a reformer 46 for reforming a mixed gas of a raw fuel and water vapor to produce a fuel gas supplied to the fuel cell stack 24, an evaporator 48 for evaporating water and supplying water vapor to the reformer 46, a heat exchanger 50 for raising the temperature of the oxygen-containing gas by heat exchange with a combustion gas and supplying the oxygen-containing gas to the fuel cell stack 24, an exhaust gas combustor 52 for combusting the fuel gas discharged from the fuel cell stack 24 as a fuel exhaust gas and the oxygen-containing gas discharged from the fuel cell stack 24 as the oxygen-containing exhaust gas to produce the combustion gas, and a start-up combustor 54 for combusting the raw fuel and the oxygen-containing gas to produce the combustion gas.

Basically, the fuel cell module 12 includes the fuel cell stack 24 and FC (fuel cell) peripheral equipment 56. The FC peripheral equipment 56 includes the reformer 46, the evaporator 48, the heat exchanger 50, the exhaust gas combustor 52, and the start-up combustor 54. Further, as described later, no combustion gas pipes are provided between the reformer 46, the heat exchanger 50, the exhaust gas combustor 52, and the start-up combustor 54.

The raw fuel supply apparatus 14 has a raw fuel channel 57 for supplying the raw fuel to the reformer 46. The oxygen-containing gas supply apparatus 16 has an oxygen-containing gas channel 58 for supplying the oxygen-containing gas from the heat exchanger 50 to the fuel cell stack 24. The water supply apparatus 18 has a water channel 59 for supplying the water to the evaporator 48.

In the FC peripheral equipment 56, the exhaust gas combustor 52 is provided integrally in the heat exchanger 50. The start-up combustor 54 is provided adjacent to one end of the heat exchanger 50. The reformer 46 is provided adjacent to the other end of the heat exchanger 50.

Figure 2:
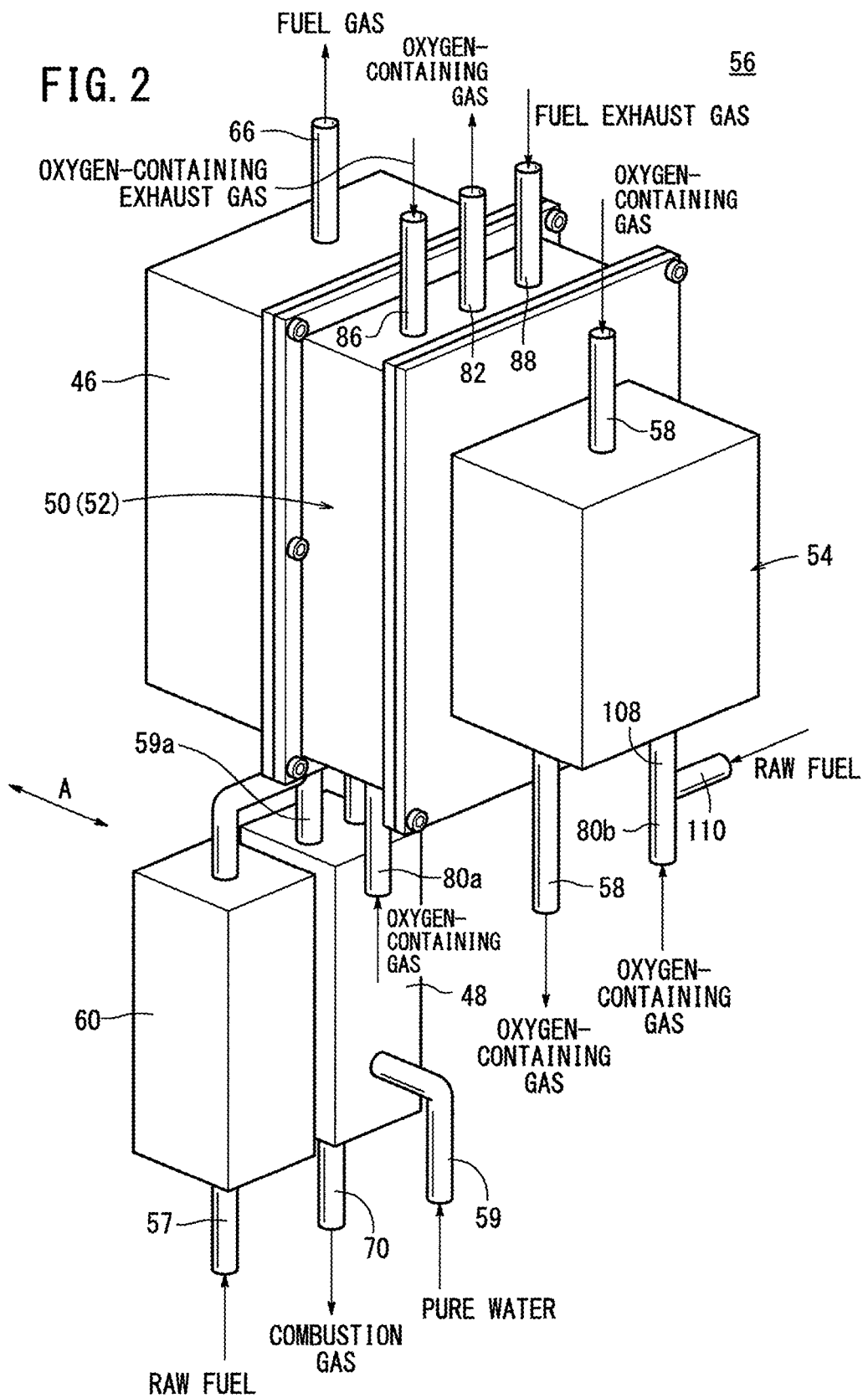
FIG. 2 is a perspective view schematically showing FC (fuel cell) peripheral equipment of the fuel cell module.
Figure 3:
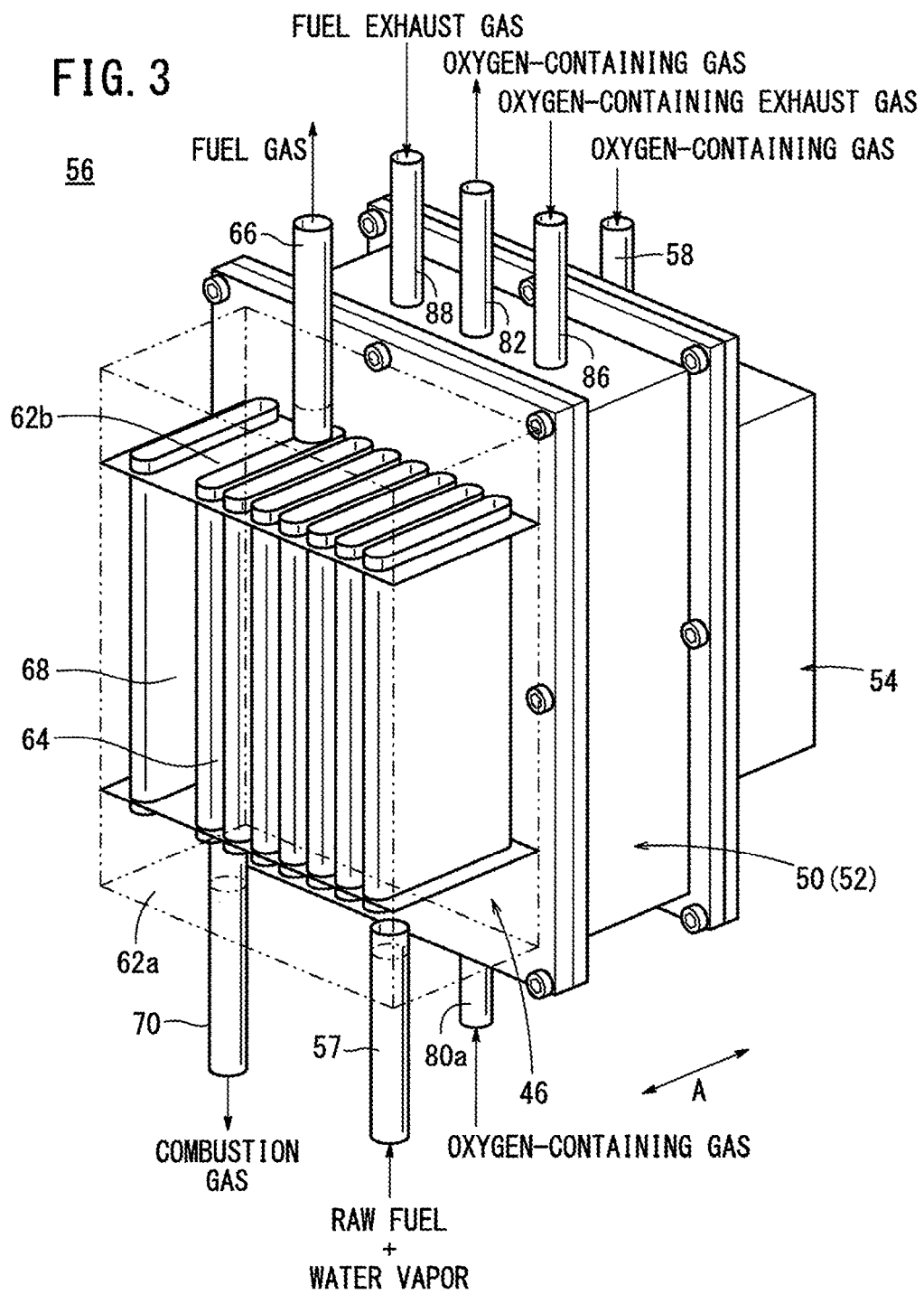
FIG. 3 is a perspective view showing main components of the FC peripheral equipment.
Figure 4:
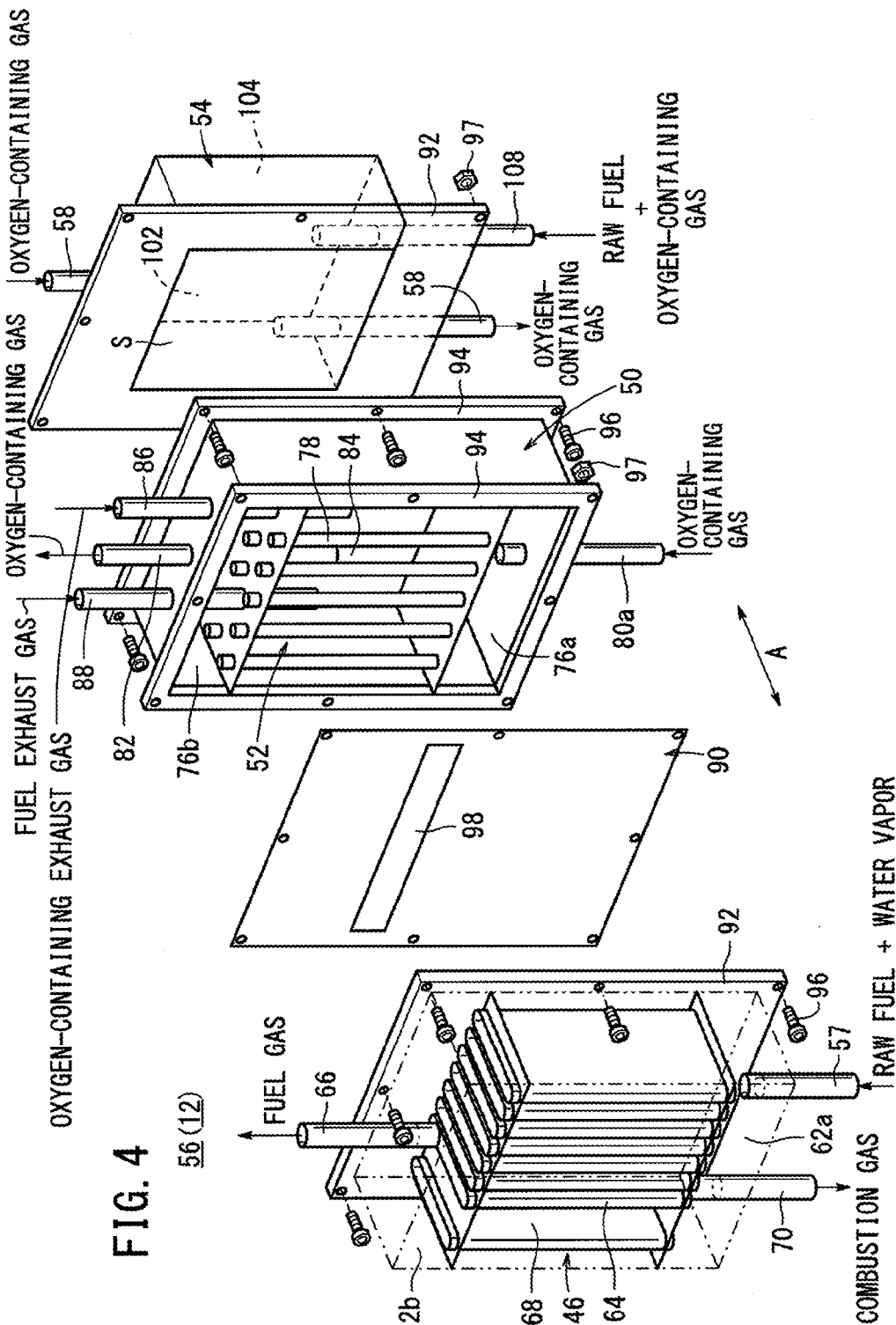
FIG. 4 is an exploded perspective view showing main components of the FC peripheral equipment.

As shown in FIGS. 2 to 4, the heat exchanger 50 is provided upright, and as described later, the oxygen-containing gas flows vertically upwardly. The reformer 46 is provided upright, and the reformed gas flows vertically upwardly. The start-up combustor 54 is directly attached to one side (one end) of the heat exchanger 50, and the reformer 46 is directly attacked to the other side (the other end) of the heat exchanger 50. The reformer 46, the heat exchanger 50 (including the exhaust gas combustor 52), and the start-up combustor 54 are stacked in a horizontal direction indicated by an arrow A.

As shown in FIG. 2, the evaporator 48 and a desulfurizer 60 for removing sulfer compounds in the city gas (raw fuel) are provided below the heat exchanger 50 and the reformer 46.

The reformer 46 is a preliminary reformer for reforming higher hydrocarbon ($C_{2+}$) such as ethane ($C_2H_6$), propane ($C_3H_8$), and butane ($C_4H_{10}$) in the city gas (raw fuel) to produce the fuel gas chiefly containing methane ($CH_4$), hydrogen, and CO by steam reforming. The operating temperature of the reformer 46 is several hundred ° C.

The operating temperature of the fuel cell 22 is high, at several hundred ° C. Methane in the fuel gas is reformed at the anode 30 to obtain hydrogen and CO, and the hydrogen and CO are supplied to the portion of the electrolyte 26 adjacent to the anode 30.

As shown in FIG. 1, the raw fuel supply apparatus 14 includes the desulfurizer 60, and the desulfurizer 60 is provided in a middle of the raw fuel channel 57. This raw fuel channel 57 is connected to a reform gas supply chamber 62a of the reformer 46.

Figure 5:
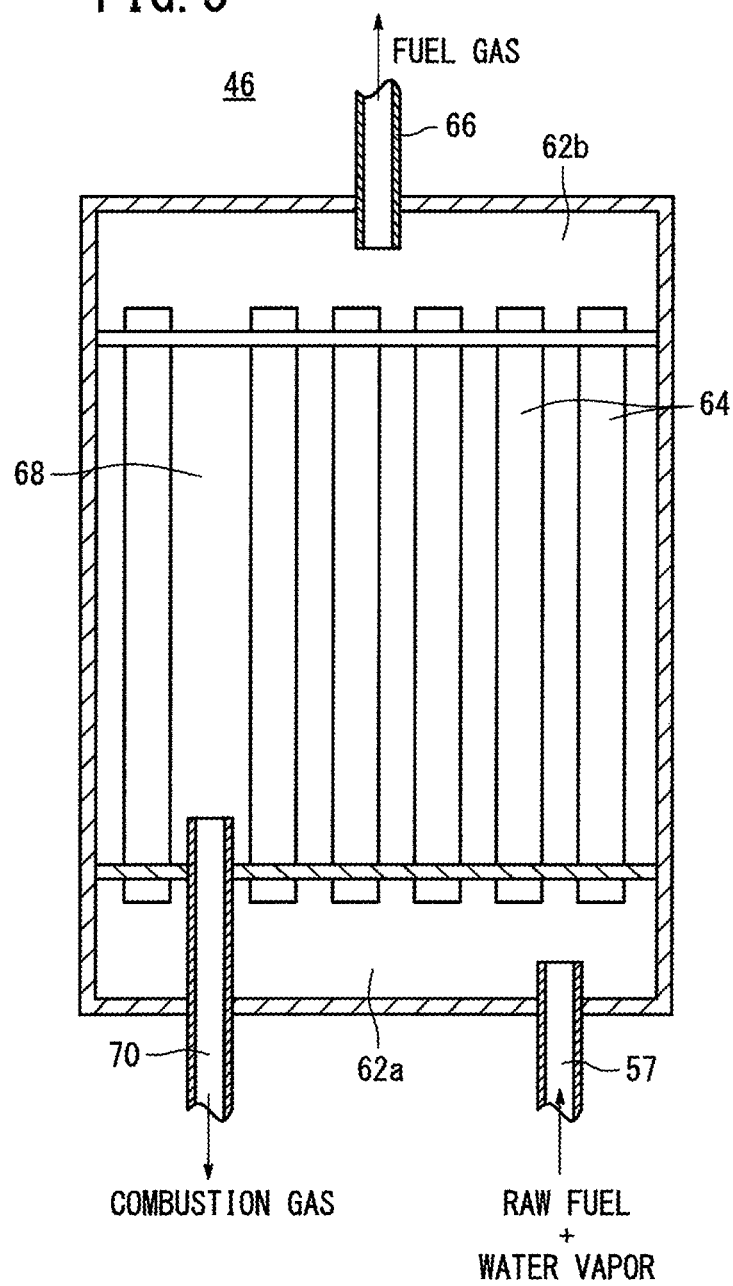
FIG. 5 is a partial cross sectional front view showing a reformer of the FC peripheral equipment.

As shown in FIGS. 3 and 5, the reform gas supply chamber 62a is connected to lower ends of a plurality of reforming pipes 64, and a reform gas discharge chamber 62b is connected to upper ends of the reforming pipes 64. The reform gas discharge chamber 62b is connected to one end of a fuel gas channel 66, and the other end of the fuel gas channel 66 is connected to the fuel gas supply passage 44a of the fuel cell stack 24 (see FIG. 1). Catalyst in the form of pellets (not shown) for inducing reforming reaction is filled in each of the reforming pipes 64.

A heating space 68 is formed between the reforming pipes 64. An end of a combustion gas channel 70 is opened to the heating space 68, and as shown in FIG. 1, a heating channel 72 of the evaporator 48 is provided in the middle of the combustion gas channel 70. A first thermoelectric converter 74 is connected to the other end of the combustion gas channel 70.

A water channel 59 of the water supply apparatus 18 is connected to the inlet of the evaporator 48. The water flowing through the water channel 59 is heated by the combustion gas flowing along the heating channel 72, and a water vapor is produced. One end of a water vapor channel 59a is connected to the outlet of the evaporator 48, and the other end of the water vapor channel 59a is merged to the raw fuel channel 57 at a position downstream of the desulfurizer 60.

Figure 6:
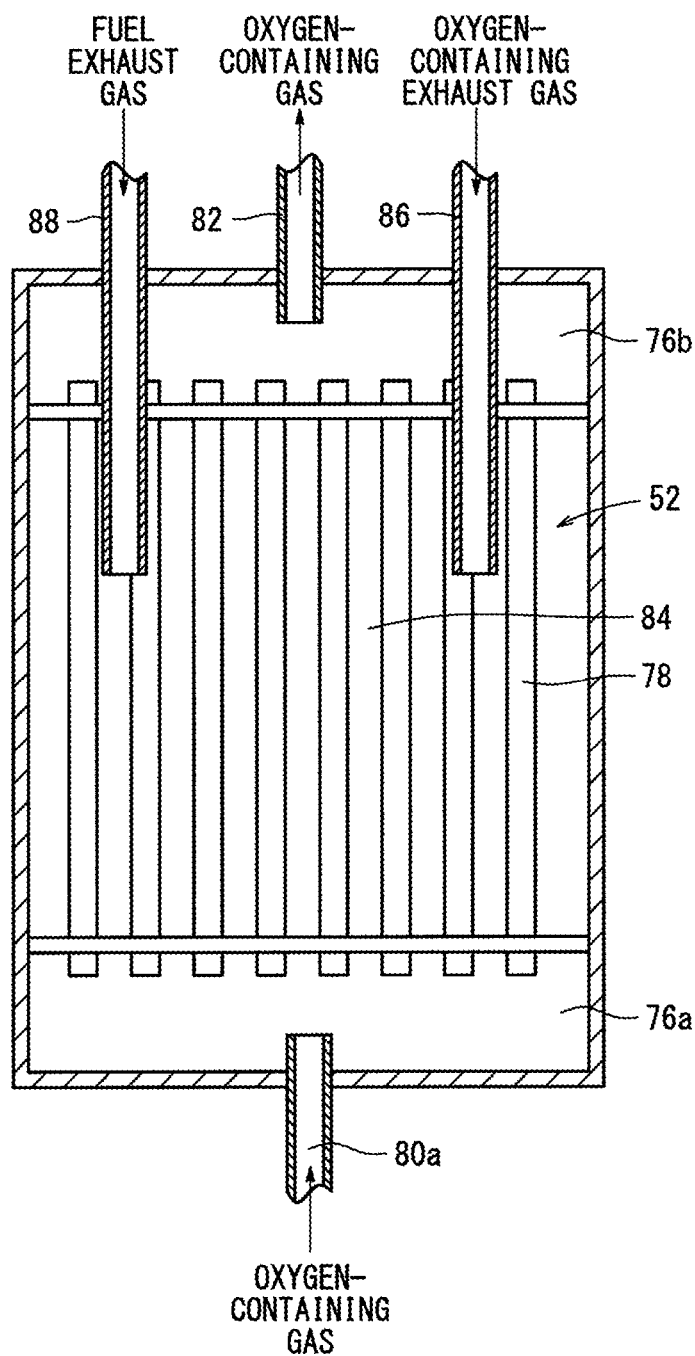
FIG. 6 is a partial cross sectional front view showing a heat exchanger and an exhaust gas combustor of the FC peripheral equipment.

As shown in FIGS. 4 and 6, an oxygen-containing gas supply chamber 76a is provided on the lower side of the heat exchanger 50, and an oxygen-containing gas discharge chamber 76b is provided on the upper side of the heat exchanger 50. Both ends of a plurality of oxygen-containing gas pipes 78 are connected to the oxygen-containing gas supply chamber 76a and the oxygen-containing gas discharge chamber 76b.

One end of a first oxygen-containing gas supply channel 80a of the oxygen-containing gas channel 58 is provided in the oxygen-containing gas supply chamber 76a. One end of an oxygen-containing gas supply channel 82 is provided in the oxygen-containing gas discharge chamber 76b, and the other end of the oxygen-containing gas supply channel 82 is connected to the oxygen-containing gas supply passage 42a of the fuel cell stack 24 (see FIG. 1).

A plurality of the oxygen-containing gas pipes 78 are placed in the space inside the heat exchanger 50. Further, a combustion chamber 84 of the exhaust gas combustor 52 is formed inside the heat exchanger 50. The combustion chamber 84 functions as a heat source for raising the temperature of the oxygen-containing gas by combustion reaction of the fuel gas (specifically, fuel exhaust gas) and the oxygen-containing gas (specifically, oxygen-containing exhaust gas).

An oxygen-containing exhaust gas channel 86 and a fuel exhaust gas channel 88 extend through the oxygen-containing gas discharge chamber 76b, and one end of the oxygen-containing exhaust gas channel 86 and one end of the fuel exhaust gas channel 88 are provided in the combustion chamber 84. As shown in FIG. 1, the other end of the oxygen-containing exhaust gas channel 86 is connected to the oxygen-containing gas discharge passage 42b of the fuel cell stack 24, and the other end of the fuel exhaust gas channel 88 is connected to the fuel gas discharge passage 44b of the fuel cell stack 24.

As shown in FIG. 4, a wall plate (wall) 90 is provided between the reformer 46 and the heat exchanger 50. The wall plate 90 is sandwiched between a flange 92 of the reformer 46 and a flange 94 of the heat exchanger 50. These components are fixed together using a plurality of bolts 96 and nuts 97. An opening (combustion gas channel) 98 is formed in the wall plate 90 for supplying a combustion gas produced in the combustion chamber 84 of the heat exchanger 50 to the heating space 68 of the reformer 46.

Figure 7:
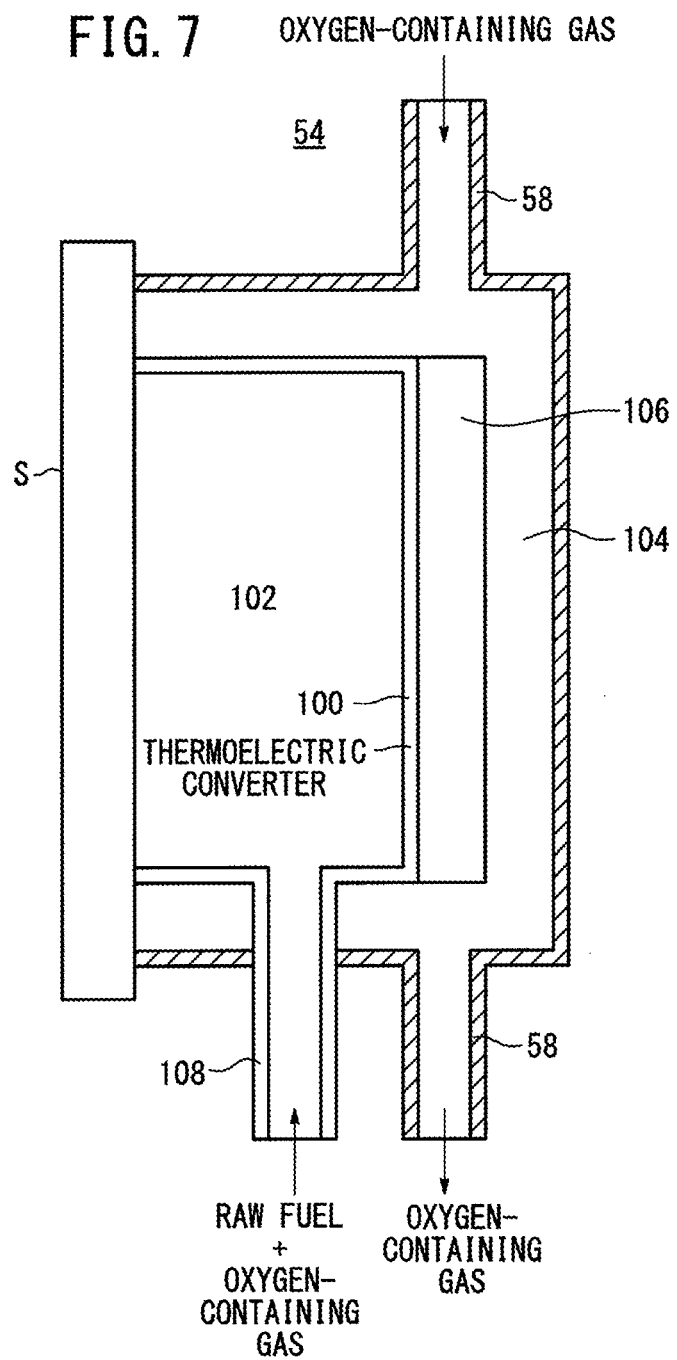
FIG. 7 is a partial cross sectional side view showing a start-up combustor of the FC peripheral equipment.

As shown in FIG. 7, a combustion chamber 102 is formed in the start-up combustor 54 through an internal casing 100, and a cooling channel 104 for cooling the combustion chamber 102 is provided outside the internal casing 100. The oxygen-containing gas channel 58 of the oxygen-containing gas supply apparatus 16 is connected to an upper portion and a lower portion of the cooling channel 104 (see FIG. 1).

A rectangular flaming area S is designated in correspondence with the combustion chamber 84 of the exhaust gas combustor 52 (see FIG. 4). A second thermoelectric converter 106 is provided between the combustion chamber 102 and the cooling channel 104. A pre-mixing fuel channel 108 is connected to this combustion chamber 102. As shown in FIG. 1, a second oxygen-containing gas supply channel 80b and a raw fuel branch channel 110 branched from the raw fuel channel 57 are connected to the pre-mixing fuel channel 108.

As shown in FIG. 4, the flanges 92, 94 of the start-up combustor 54 and the heat exchanger 50 are fixed together using a plurality of bolts 96 and nuts 97.

Figure 8:
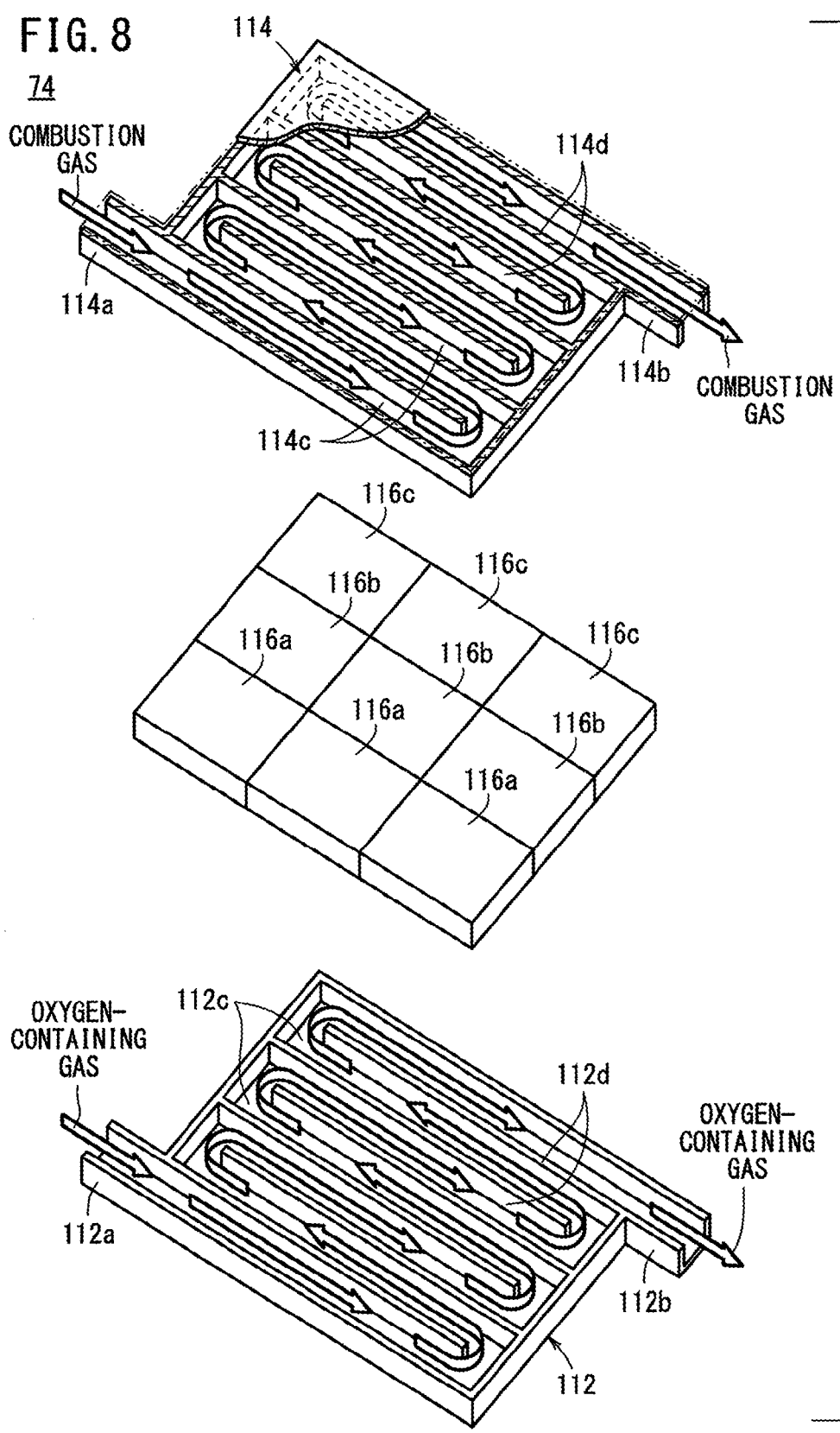
FIG. 8 is an exploded perspective view showing main components of a first thermoelectric converter of the fuel cell module.

As shown in FIG. 1, the first thermoelectric converter 74 is provided in the oxygen-containing gas channel 58 at a position upstream of the heat exchanger 50, more preferably, upstream of the cooling channel 104. As shown in FIG. 8, the first thermoelectric converter 74 includes a first channel member 112 as a passage of the oxygen-containing gas as a heated medium, a second channel member 114 as a passage of the combustion gas as a heating medium, and a plurality of thermoelectric conversion elements 116a, 116b, and 116c each having a different thermoelectric conversion temperature.

The first channel member 112 has a box shape, and includes a serpentine oxygen-containing gas channel 112c extending in a serpentine pattern between an oxygen-containing gas inlet 112a and an oxygen-containing gas outlet 112b. The serpentine oxygen-containing gas channel 112c is formed by partition plates 112d provided alternately in a zigzag pattern in the first channel member 112.

The second channel member 114 has a box shape, and includes a serpentine combustion gas channel 114c extending in a serpentine pattern between a combustion gas inlet 114a and a combustion gas outlet 114b. The serpentine combustion gas channel 114c is formed by partition plates 114d provided alternately in a zigzag pattern in the second channel member 114. The combustion gas in the serpentine combustion gas channel 114c and the oxygen-containing gas in the serpentine oxygen-containing gas channel 112c flow in parallel to each other.

Both ends of thermoelectric conversion elements 116a, 116b, and 116c are sandwiched between the first channel member 112 and the second channel member 114, and the thermoelectric conversion elements 116a, 116b, and 116c are capable of generating an electromotive force by the temperature between these ends. A plurality of thermoelectric conversion elements 116a (though three thermoelectric conversion elements 116a are provided in FIG. 8, the number of the thermoelectric conversion elements 116a can be determined arbitrarily. Likewise, the number of the thermoelectric conversion elements 116b and the thermoelectric conversion elements 116c can be determined arbitrarily.) are provided on the upstream side of the serpentine oxygen-containing gas channel 112c and the serpentine combustion gas channel 114c. The thermoelectric conversion elements 116a are hot temperature type thermoelectric conversion elements having a high thermoelectric conversion temperature.

The thermoelectric conversion elements 116b provided in the mid-portions of the serpentine oxygen-containing gas channel 112c and the serpentine combustion gas channel 114c are intermediate temperature type thermoelectric conversion elements having an intermediate thermoelectric conversion temperature. The thermoelectric conversion elements 116c provided on the downstream side of the serpentine oxygen-containing gas channel 112c and the serpentine combustion gas channel 114c are low temperature thermoelectric conversion elements having a low thermoelectric conversion temperature.

The second thermoelectric converter 106 has structure identical to the first thermoelectric converter 74. In the second thermoelectric converter 106, the oxygen-containing gas is supplied from the cooling channel 104, and the combustion gas is supplied from the combustion chamber 102. Though not shown, the oxygen-containing gas and the combustion gas flow in parallel to each other, and a plurality of thermoelectric conversion elements are provided between the serpentine oxygen-containing gas channel and the serpentine combustion gas channel.

As shown in FIG. 1, the oxygen-containing gas supply apparatus 16 has an oxygen-containing gas regulator valve 118 for distributing the oxygen-containing gas from the oxygen-containing gas channel 58 to the heat exchanger 50 and the start-up combustor 54, i.e., the first oxygen-containing gas supply channel 80a and the second oxygen-containing gas supply channel 80b.

The raw fuel supply apparatus 14 has a raw fuel regulator valve 120 for distributing the raw fuel to the reformer 46 and the start-up combustor 54, i.e., the raw fuel channel 57 and the raw fuel branch channel 110.

Figure 9:
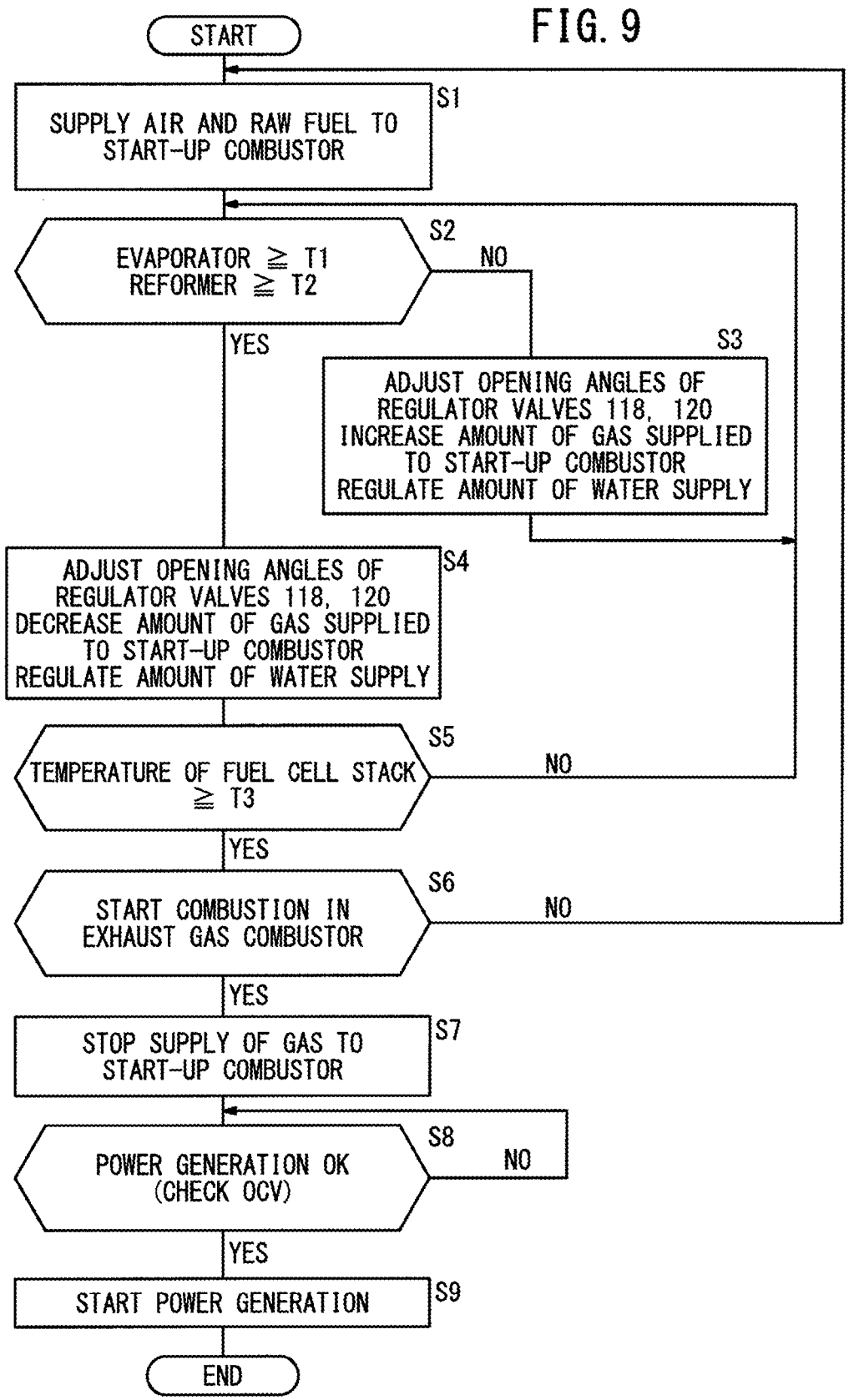
FIG. 9 is a flow chart illustrating operation from start-up operation to steady operation of the fuel cell system.

Next, operation of the fuel cell system 10 will be described below with reference to a flow chart of FIG. 9.

At the time of starting operation of the fuel cell system 10, the air (oxygen-containing gas) and the raw fuel are supplied to the start-up combustor 54 (step S1). Specifically, in the oxygen-containing gas supply apparatus 16, the air is supplied to the oxygen-containing gas channel 58 by operation of the air pump. After the air flows through the first thermoelectric converter 74, the air flows into the cooling channel 104 of the start-up combustor 54 (this operation will be described later). Further, the air is supplied from the second oxygen-containing gas supply channel 80b to the pre-mixing fuel channel 108 by operation of adjusting the opening angle of the oxygen-containing gas regulator valve 118.

In the raw fuel supply apparatus 14, raw fuel such as the city gas (containing $CH_4$, $C_2H_6$, $C_3H_8$, $C_4H_{10}$) is supplied to the raw fuel channel 57 by operation of the fuel gas pump. The raw fuel flows into the raw fuel branch channel 110 by operation of adjusting the opening angle of the raw fuel regulator valve 120. This raw fuel is supplied to the pre-mixing fuel channel 108, and mixed with the air. Further, the raw fuel is supplied to the combustion chamber 102 in the start-up combustor 54.

Therefore, the mixed gas of the raw fuel and the air is supplied into the combustion chamber 102, and the mixed gas is ignited to start combustion. Thus, as shown in FIG. 4, since the heat exchanger 50 is directly connected to the start-up combustor 54, the combustion gas is supplied to the combustion chamber 84 of the exhaust gas combustor 52 from the flaming area S of the start-up combustor 54.

The combustion gas supplied to the combustion chamber 84 heats the heat exchanger 50, and the combustion gas moves to the heating space 68 of the reformer 46 through the opening 98 formed in the wall plate 90. Thus, the reformer 46 is heated. The combustion gas channel 70 is opened to the heating space 68, and the combustion gas channel 70 is connected to the heating channel 72 of the evaporator 48. In the structure, after the combustion gas heats the evaporator 48, the combustion gas is supplied to the first thermoelectric converter 74.

As shown in FIG. 8, in the first thermoelectric converter 74, the oxygen-containing gas as the external air is supplied from the oxygen-containing gas inlet 112a of the first channel member 112 to the serpentine oxygen-containing gas channel 112c, and the combustion gas is supplied from the combustion gas inlet 114a of the second channel member 114 to the serpentine combustion gas channel 114c. Thus, temperature differences occur between both ends of the thermoelectric conversion elements 116a, 116b, and 116c between the serpentine oxygen-containing gas channel 112c and the serpentine combustion gas channel 114c, and the heat energy is collected as electrical energy.

In the second thermoelectric converter 106, the oxygen-containing gas is supplied from the cooling channel 104, and the combustion gas is supplied from the combustion chamber 102. Thus, as in the case of the first thermoelectric converter 74, temperature differences occur between both ends of thermoelectric conversion elements (not shown), and the heat energy is collected as electrical energy.

Then, the control proceeds to step S2 to determine whether or not the temperature of the evaporator 48 is a predetermined temperature T1 or more and the temperature of the reformer 46 is a predetermined temperature T2 or more. For example, the predetermined temperature T1 is 150° C., and for example, the predetermined temperature T2 is 550° C. If the temperature of the evaporator 48 is less than the predetermined temperature T1 or the temperature of the reformer 46 is less than the predetermined temperature T2, the control proceeds to step S3 (NO in step S2).

In step S3, the opening angle of the oxygen-containing gas regulator valve 118 is adjusted, and the amount of the air supplied to the second oxygen-containing gas supply channel 80b is increased. Further, the opening angle of the raw fuel regulator valve 120 is adjusted, and the amount of the raw fuel supplied to the raw fuel branch channel 110 is increased. Thus, the combustion rate in the start-up combustor 54 is increased, and the amount of the generated heat energy is increased. In the water supply apparatus 18, the amount of water supplied to the evaporator 48 is regulated.

If it is determined that the temperature of the evaporator 48 is the predetermined temperature T1 or more and the temperature of the reformer 46 is the predetermined temperature T2 or more (YES in step S2), the control proceeds to step S4. In step S4, the opening angle of the oxygen-containing gas regulator valve 118 is adjusted to reduce the amount of the air supplied to the second oxygen-containing gas supply channel 80b. Further, the opening angle of the raw fuel regulator valve 120 is adjusted to reduce the amount of the raw fuel supplied to the raw fuel branch channel 110. Thus, the combustion rate in the start-up combustor 54 becomes low, and the amount of the generated heat energy is decreased. In the water supply apparatus 18, the amount of water supplied to the evaporator 48 is regulated.

Thus, in the oxygen-containing gas supply apparatus 16, the flow rate of the air supplied to the first oxygen-containing gas supply channel 80a is increased by the oxygen-containing gas regulator valve 118, and the air flows into the oxygen-containing gas supply chamber 76a of the heat exchanger 50.

As shown in FIG. 6, after the air flows into the oxygen-containing gas supply chamber 76a, the air is heated by the combustion gas supplied into the combustion chamber (heat exchange between the air and the combustion gas occurs) while the air is moving from the lower ends to the upper ends of the oxygen-containing gas pipes 78. The heated air is supplied to the oxygen-containing gas discharge chamber 76b temporarily, and then, the air is supplied through the oxygen-containing gas supply channel 82 to the oxygen-containing gas supply passage 42a of the fuel cell stack 24 (see FIG. 1).

In the fuel cell stack 24, after the heated air flows through the oxygen-containing gas flow field 38, the air is discharged from the oxygen-containing gas discharge passage 42b into the oxygen-containing exhaust gas channel 86. As shown in FIG. 6, since the oxygen-containing exhaust gas channel 86 is opened to the combustion chamber 84 of the exhaust gas combustor 52, the air is supplied into the combustion chamber 84.

Further, in the raw fuel supply apparatus 14, as shown in FIG. 1, the flow rate of the raw fuel supplied to the raw fuel channel 57 to the desulfurizer 60 is increased by the raw fuel regulator valve 120. After sulfur is removed from the raw fuel by the desulfurizer 60, the raw fuel flows through the raw fuel channel 57, and the raw fuel is supplied to the reform gas supply chamber 62a of the reformer 46. After the water supplied from the water supply apparatus 18 to the water channel 59 is evaporated by the evaporator 48, the water flows through the raw fuel channel 57 from the water vapor channel 59a, and the water is supplied to the reform gas supply chamber 62a.

As shown in FIG. 5, the mixed gas of the raw fuel and the water vapor supplied to the reform gas supply chamber 62a moves through the lower ends to the upper ends of the reforming pipes 64. In the meanwhile, the mixed gas is heated by the combustion gas supplied into the heating space 68, and steam reforming is induced by the catalyst in the form of pellets. Reforming reaction occur by removal of hydrocarbon of $C_{2+}$ to produce a reformed gas chiefly containing methane. The reformed gas is supplied to the reform gas discharge chamber 62b temporarily as a heated fuel gas, and then, the reformed gas is supplied to the fuel gas supply passage 44a of the fuel cell stack 24 through the fuel gas channel 66 (see FIG. 1).

In the fuel cell stack 24, after the heated fuel gas flows through the fuel gas flow field 40, the fuel gas is discharged from the fuel gas discharge passage 44b to the fuel exhaust gas channel 88. As shown in FIG. 6, since the fuel exhaust gas channel 88 is opened to the combustion chamber 84 of the exhaust gas combustor 52, the fuel gas flows into the combustion chamber 84.

As described above, heated air and the heated fuel gas flow through the fuel cell stack 24 to raise the temperature of the fuel cell stack 24. If it is determined that the temperature of the fuel cell stack 24 is a predetermined temperature T3 (e.g., 650° C.) or more (YES in step S5), the control proceeds to step S6. In step S6, it is determined whether or not combustion is started in the exhaust gas combustor 52.

As shown in FIG. 6, the air is supplied to the combustion chamber 84 of the exhaust gas combustor 52 through the oxygen-containing exhaust gas channel 86, and the fuel gas is supplied to the combustion chamber 84 through the fuel exhaust gas channel 88. Therefore, by heating operation of the start-up combustor 54, when the temperature in the exhaust gas combustor 52 exceeds the self-ignition temperature of the fuel gas, combustion by the air and the fuel gas is started in the combustion chamber 84 (YES in step S6).

When combustion in the exhaust gas combustor 52 is started, the control proceeds to step S7 for adjusting the opening angle of the oxygen-containing gas regulator valve 118 and the opening angle of the raw fuel regulator valve 120, and the supply of the air and the raw fuel to the start-up combustor 54 is stopped.

Then, the control proceeds to step S8 for determining whether or not power generation can be performed in the fuel cell stack 24. Specifically, OCV (open-circuit voltage) of the fuel cell 22 is measured, and when the OCV reaches a predetermined value, it is determined that power generation can be performed in the fuel cell stack 24 (YES in step S8). Thus, power generation is started in the fuel cell stack 24 (step S9).

During power generation of the fuel cell stack 24, in the same manner as in the case of the start-up operation, the air flows through the oxygen-containing gas flow field 38, and the fuel gas flows through the fuel gas flow field 40. Therefore, the air is supplied to the cathode 28 of each fuel cell 22, and the fuel gas is supplied to the anode 30 of each fuel cell 22 to induce chemical reactions at the cathode 28 and the anode 30 for generating electricity.

The air partially consumed in the reaction (containing unconsumed air) is discharged as oxygen-containing exhaust gas to the oxygen-containing exhaust gas channel 86. Further, the fuel gas partially consumed in the reaction (containing unconsumed fuel gas) is discharged as the fuel exhaust gas to the fuel exhaust gas channel 88. The oxygen-containing exhaust gas and the fuel exhaust gas are supplied to the exhaust gas combustor 52, and combusted in the exhaust gas combustor 52.

In the first embodiment, the fuel cell module 12 includes the first thermoelectric converter 74 and the second thermoelectric converter 106 for performing thermoelectric conversion based on the temperature difference between the oxygen-containing gas and the combustion gas. As shown in FIG. 8, the first thermoelectric converter 74 includes the first channel member 112 as a passage of the oxygen-containing gas as a heated medium, the second channel member 114 as a passage of the combustion gas as a heating medium, and the plurality of thermoelectric conversion elements 116a, 116b, and 116c each having a different thermoelectric conversion temperature provided between the first channel member 112 and the second channel member 114.

In the structure, the first thermoelectric converter 74 and the second thermoelectric converter 106 can collect electrical energy based on the temperature difference between the combustion gas and the oxygen-containing gas. That is, the heat energy can be collected as electrical energy. In particular, it becomes possible to improve the power generation efficiency without any losses in the start-up time.

Further, since the temperature of the combustion gas is decreased, generation of waste heat is suppressed. Moreover, since the temperature of the oxygen-containing gas is increased, thermally self-sustaining operation is facilitated.

The combustion gas herein is a gas generated by the exhaust gas combustor 52 and the start-up combustor 54. The combustion gas is a heating medium which can provide heat by performing heat exchange with a fluid to be heated (e.g., another gas). After heat energy is released from the combustion gas, the combustion gas is referred to as the exhaust gas. Further, thermally self-sustaining operation herein means operation where the entire amount of heat quantity required for operating the fuel cell system is supplied within the fuel cell system, and where the operating temperature of the fuel cell system 10 is maintained using only heat energy generated in the fuel cell system 10, without supplying additional heat from the outside.

Further, in the fuel cell module 12, the combustion gas channel 70 for supplying the combustion gas successively to the heat exchanger 50, the reformer 46, and the evaporator 48, and the oxygen-containing gas channel 58 for supplying the oxygen-containing gas from the heat exchanger 50 to the fuel cell stack 24 are provided. The first thermoelectric converter 74 is provided downstream of the evaporator 48 in the combustion gas channel 70, and provided upstream of the heat exchanger 50 in the oxygen-containing gas channel 58.

Thus, the temperature difference between the combustion gas and the oxygen-containing gas, i.e., the heat energy can be collected as electrical energy without hindering thermally self-sustaining operation, and it becomes possible to improve the power generation efficiency. Further, since the temperature of the combustion gas is decreased, generation of waste heat is suppressed. Moreover, since the temperature of the oxygen-containing gas is increased, thermally self-sustaining operation is facilitated.

Further, in the fuel cell module 12, the oxygen-containing gas channel 58 includes the cooling channel 104 for cooling the start-up combustor 54, at a position upstream of the heat exchanger 50, and the first thermoelectric converter 74 is provided upstream of the cooling channel 104. Therefore, the oxygen-containing gas is supplied as the coolant for cooling the start-up combustor 54 before the oxygen-containing gas is supplied to the heat exchanger 50.

In the structure, the temperature in the start-up combustor 54 can be kept at the self-ignition temperature of the fuel gas or less, and occurrence of back fire is suppressed. Thus, improvement in the durability of the start-up combustor 54 is achieved easily. Further, since the air (oxygen-containing gas) having a relatively low temperature is supplied to the first thermoelectric converter 74, it is ensured that the there is a significant temperature difference between the air and the combustion gas. Thus, thermoelectric conversion can be performed efficiently.

Further, the second thermoelectric converter 106 is provided in the start-up combustor 54. Thus, the temperature difference between the combustion gas and the oxygen-containing gas, i.e., the heat energy can be collected as electrical energy without hindering thermally self-sustaining operation, and it becomes possible to improve the power generation efficiency. Further, since the temperature of the combustion gas is decreased, generation of waste heat is suppressed. Moreover, since the temperature of the oxygen-containing gas is increased, thermally self-sustaining operation is facilitated.

In the first thermoelectric converter 74 (and the second thermoelectric converter 106), the combustion gas flowing through the serpentine combustion gas channel 114c and the oxygen-containing gas flowing through the serpentine oxygen-containing gas channel 112c flow in parallel to each other, and the thermoelectric conversion elements 116a, 116b, and 116c each having a different thermoelectric conversion temperature are provided.

Therefore, as shown in FIG. 8, on the upstream side of the parallel flow, since the temperature difference between the combustion gas and the oxygen-containing gas is large, the hot temperature type thermoelectric conversion element 116a is used. On the downstream side of the parallel flow since the temperature difference is small, the low temperature type thermoelectric conversion element 116c is used. In this manner, since the optimum thermoelectric conversion elements 116a, 116b, and 116c are used depending on the temperature difference, the efficient thermoelectric conversion can be performed reliably.

Further, the oxygen-containing gas channel 58 is branched into the first oxygen-containing gas supply channel 80a for supplying the oxygen-containing gas to the heat exchanger 50 and the second oxygen-containing gas supply channel 80b for supplying the oxygen-containing gas to the start-up combustor 54. The oxygen-containing gas regulator valve 118 for regulating distribution of the oxygen-containing gas is provided at the branch portion.

In the system, temperatures of the fuel cell stack 24 and the FC peripheral equipment (BOP) 56 including the reformer 46, the evaporator 48, the heat exchanger 50, and the exhaust gas combustor 52 can be increased at the same time, and thus, reduction in the start-up time is achieved.

Further, since precise temperature control is implemented for each of the fuel cell stack 24 and the FC peripheral equipment 56, thermally self-sustaining operation of the fuel cell module 12 is facilitated. Moreover, if any heat shortage occurs in the fuel cell stack 24 or the FC peripheral equipment 56, heat can be supplied from the start-up combustor 54.

Further, in the fuel cell module 12, the raw fuel channel 57 for supplying raw fuel to the reformer 46 is provided, and the raw fuel branch channel 110 is branched from the raw fuel channel 57 for supplying the raw fuel from the raw fuel channel 57 to the start-up combustor 54, and at the branch portion, the raw fuel regulator valve 120 for regulating distribution of the raw fuel is provided. In the structure, temperatures of the fuel cell stack 24 and the FC peripheral equipment 56 can be increased at the same time, and reduction in the start-up time is achieved.

Further, since precise temperature control is implemented for each of the fuel cell stack 24 and the FC peripheral equipment 56, thermally self-sustaining operation of the fuel cell module 12 is facilitated. Moreover, if any heat shortage occurs in the fuel cell stack 24 or the FC peripheral equipment 56, heat can be supplied from the start-up combustor 54.

Further, the exhaust gas combustor 52 is provided integrally in the heat exchanger 50. The start-up combustor 54 is provided adjacent to one end of the heat exchanger 50 and the reformer 46 is provided adjacent to the other end of the heat exchanger 50. In the structure, the reformer 46, the heat exchanger 50, the exhaust gas combustor 52, and the start-up combustor 54 are substantially combined together. Therefore, heat radiation from the fuel cell module 12 can be minimized as much as possible. Accordingly, losses in the heat energy are suppressed, and thermally self-sustaining operation is suitably facilitated. Further, combustion circuits (e.g., pipes) are simplified, and the number of components is reduced. Thus, reduction in size and cost is achieved.

Further, the fuel cell module 12 is a solid oxide fuel cell module. Therefore, the fuel cell module 12 is applicable to high temperature type fuel cells such as SOFC.

Figure 10:
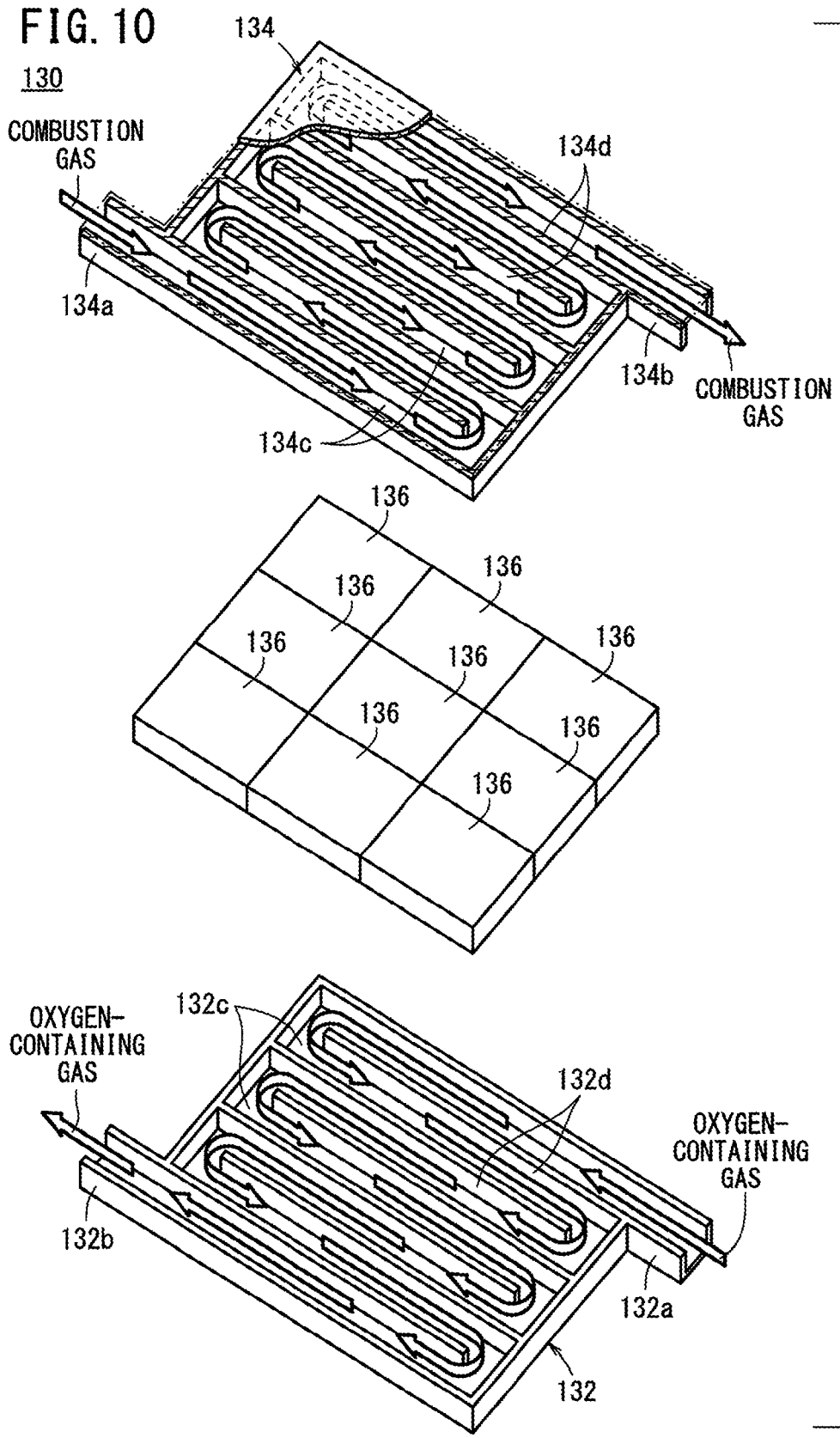
FIG. 10 is an exploded perspective view showing main components of a thermoelectric converter of a fuel cell module according to a second embodiment of the present invention.

FIG. 10 is an exploded perspective view showing main components of a thermoelectric converter 130 of a fuel cell module according to a second embodiment of the present invention.

The thermoelectric converter 130 is used instead of the first thermoelectric converter 74 and the second thermoelectric converter 106 of the fuel cell module 12 according to the first embodiment of the present invention. It should be noted that the thermoelectric converter 130 may be used only instead of the first thermoelectric converter 74 or used only instead of the second thermoelectric converter 106. Likewise, the thermoelectric converter as described later in third and fourth embodiments may be used only instead of the first thermoelectric converter 74 or used only instead of the second thermoelectric converter 106.

The thermoelectric converter 130 includes a first channel member 132 as a passage of the oxygen-containing gas, a second channel member 134 as a passage of the combustion gas, and a plurality of thermoelectric conversion elements 136 provided between the first channel member 132 and the second channel member 134. The thermoelectric conversion elements 136 have a predetermined thermoelectric conversion temperature.

The first channel member 132 includes a serpentine oxygen-containing gas channel 132c extending in a serpentine pattern between an oxygen-containing gas inlet 132a and an oxygen-containing gas outlet 132b. The serpentine oxygen-containing gas channel 132c is formed by partition plates 132d provided alternately in a zigzag pattern in the first channel member 132.

The second channel member 134 includes a serpentine combustion gas channel 134c extending in a serpentine pattern between a combustion gas inlet 134a and a combustion gas outlet 134b. The serpentine combustion gas channel 134c is formed by partition plates 134d provided alternately in a zigzag pattern in the second channel member 134. The combustion gas in the serpentine combustion gas channel 134c and the oxygen-containing gas in the serpentine oxygen-containing gas channel 132c flow in a counterflow manner.

In the second embodiment, in the thermoelectric converter 130, the combustion gas and the oxygen-containing gas flow in a counterflow manner. The thermoelectric converter 130 includes the plurality of thermoelectric conversion elements 136 having a predetermined thermoelectric conversion temperature. In the structure, in the thermoelectric converter 130, the thermoelectric conversion elements 136 having the optimum thermoelectric conversion temperature can be used depending on the expected temperature difference. Thus, efficient thermoelectric conversion can be performed reliably.

Figure 11:
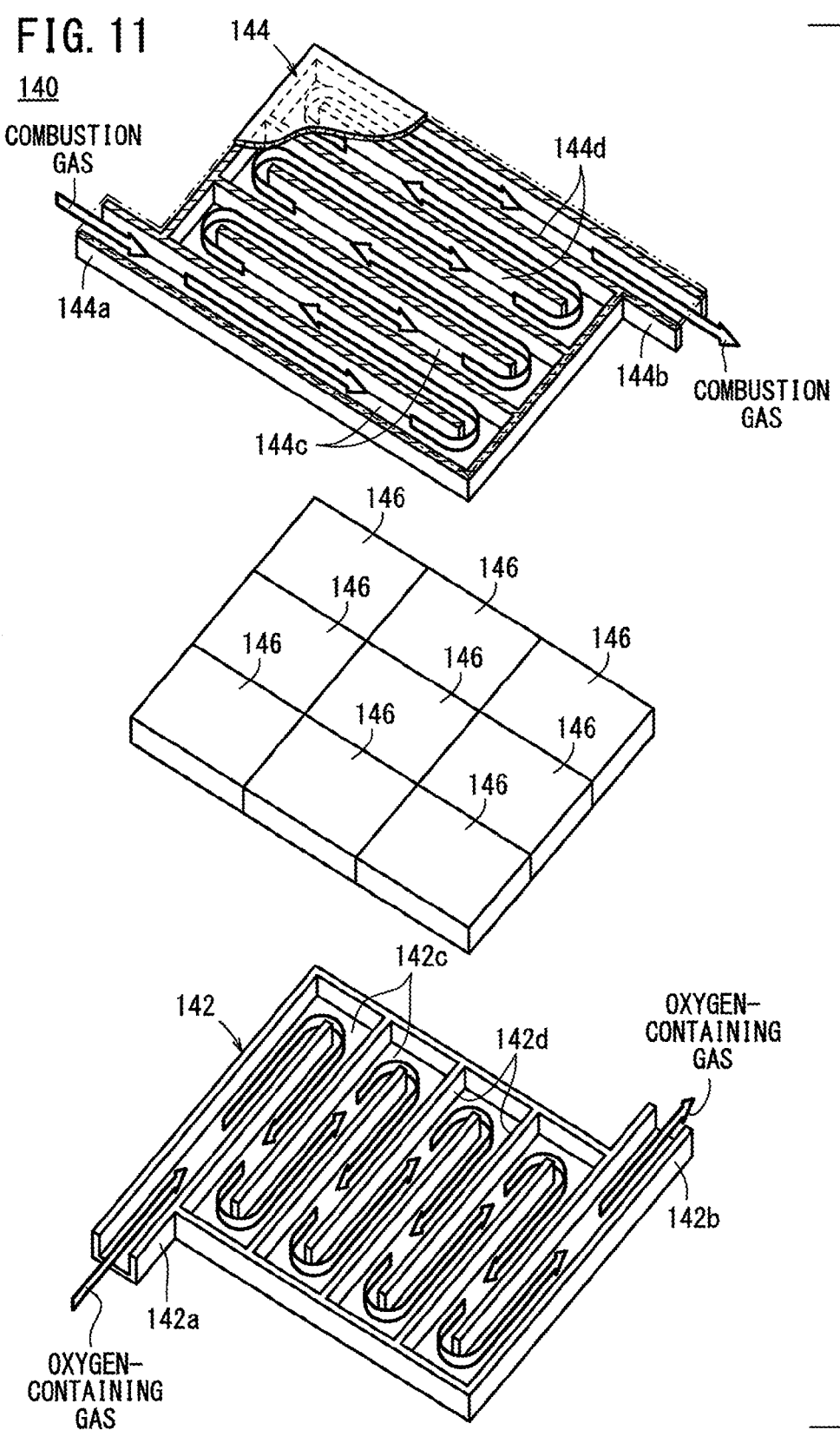
FIG. 11 is an exploded perspective view showing main components of a thermoelectric converter of a fuel cell module according to a third embodiment of the present invention.

FIG. 11 is an exploded perspective view showing main components of a thermoelectric converter 140 of a fuel cell module according to a third embodiment of the present invention.

The thermoelectric converter 140 includes a first channel member 142 as a passage of the oxygen-containing gas, a second channel member 144 as a passage of the combustion gas, and a plurality of thermoelectric conversion elements 146 provided between the first channel member 142 and the second channel member 144. The thermoelectric conversion elements 146 have a predetermined thermoelectric conversion temperature.

The first channel member 142 includes a serpentine oxygen-containing gas channel 142c extending in a serpentine pattern between an oxygen-containing gas inlet 142a and an oxygen-containing gas outlet 142b. The serpentine oxygen-containing gas channel 142c is formed by partition plates 142d provided alternately in a zigzag pattern in the first channel member 142.

The second channel member 144 includes a serpentine combustion gas channel 144c extending in a serpentine pattern between a combustion gas inlet 144a and a combustion gas outlet 144b. The serpentine combustion gas channel 144c is formed by partition plates 144d provided alternately in a zigzag pattern in the second channel member 144. The combustion gas in the serpentine combustion gas channel 144c and the oxygen-containing gas in the serpentine oxygen-containing gas channel 142c flow in a manner that the combustion gas and the oxygen-containing gas intersect with each other.

In the third embodiment, in the thermoelectric converter 140, the combustion gas and the oxygen-containing gas flow in a manner that the combustion gas and the oxygen-containing gas intersect with each other. The thermoelectric converter 140 includes a plurality of the thermoelectric conversion elements 146 having a predetermined thermoelectric conversion temperature. In the structure, in the thermoelectric converter 140, the thermoelectric conversion elements 146 having the optimum thermoelectric conversion temperature can be used depending on the expected temperature difference. Thus, efficient thermoelectric conversion can be performed reliably.

Figure 12:
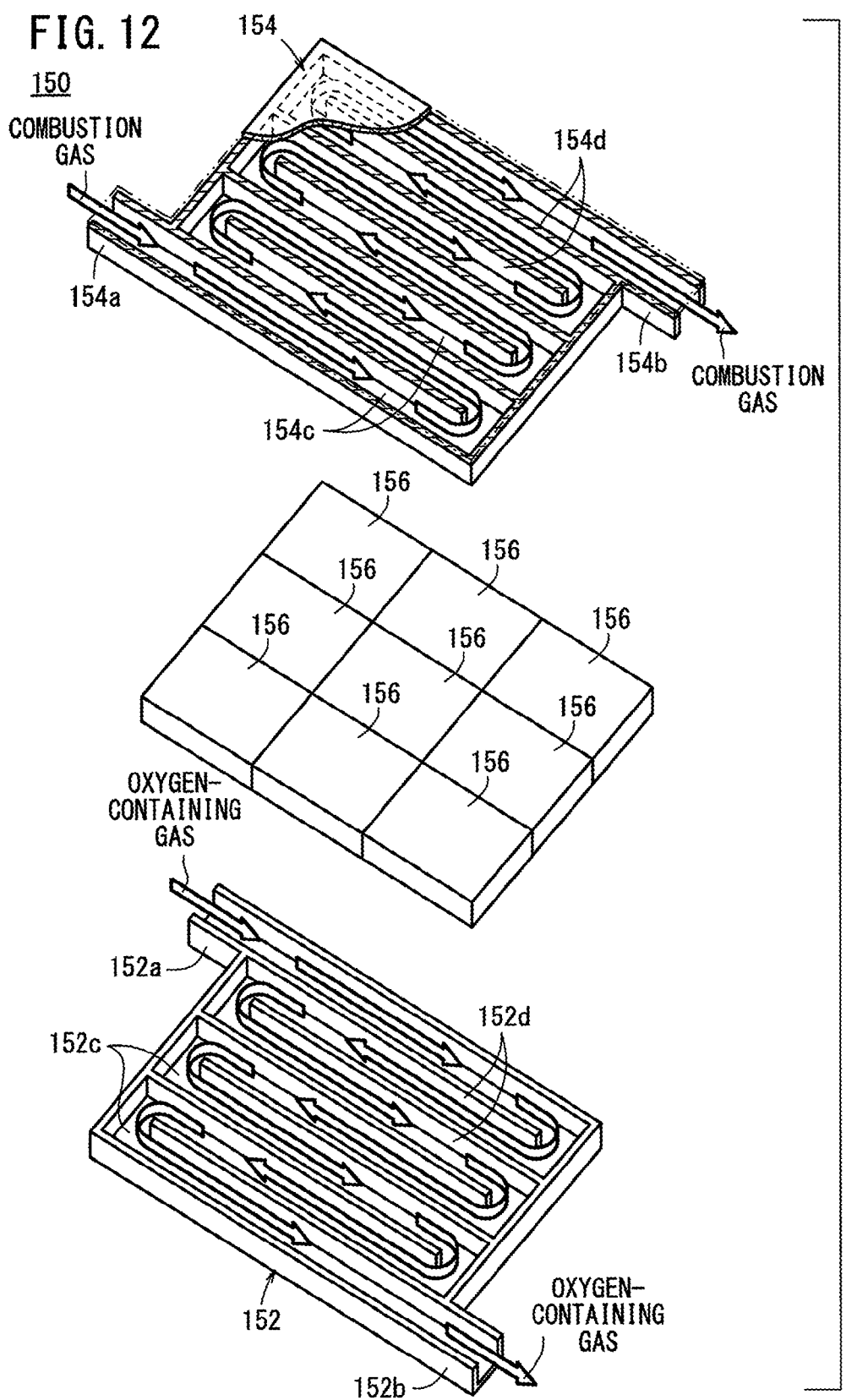
FIG. 12 is an exploded perspective view showing main components of a thermoelectric converter of a fuel cell module according to a fourth embodiment of the present invention.
Figure 13:
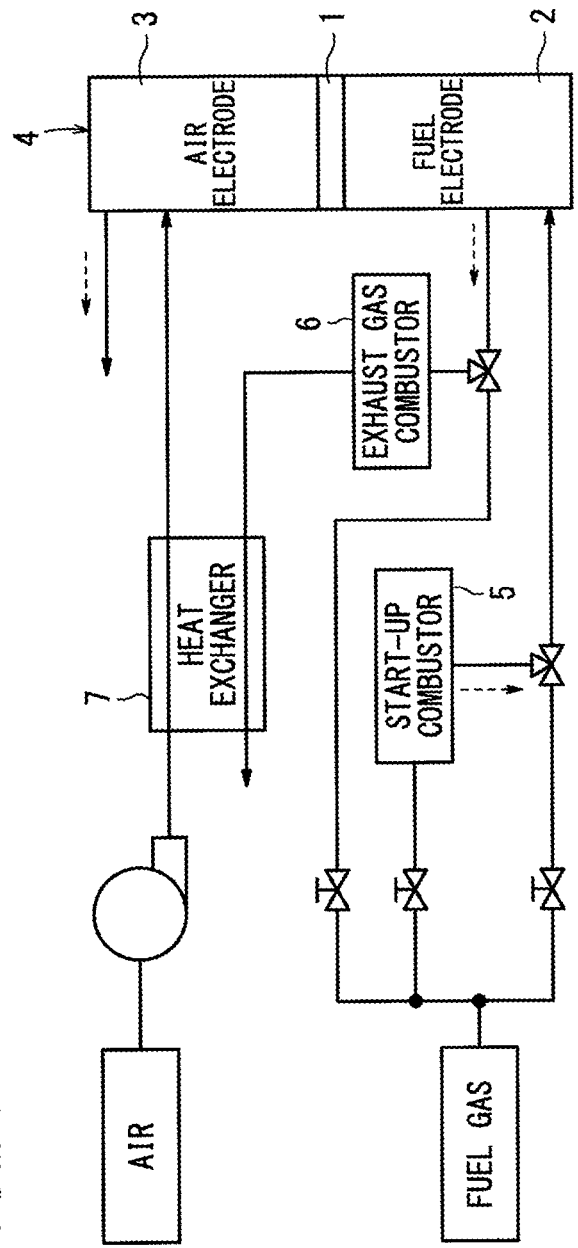
FIG. 13 is a diagram schematically showing a fuel cell system disclosed in the conventional technique 1.

FIG. 12 is an exploded perspective view showing main components of a thermoelectric converter 150 of a fuel cell module according to a fourth embodiment of the present invention.

The thermoelectric converter 150 includes a first channel member 152 as a passage of the oxygen-containing gas, a second channel member 154 as a passage of the combustion gas, and a plurality of thermoelectric conversion elements 156 provided between the first channel member 152 and the second channel member 154. The thermoelectric conversion elements 156 have a predetermined thermoelectric conversion temperature.

The first channel member 152 includes a serpentine oxygen-containing gas channel 152c extending in a serpentine pattern between an oxygen-containing gas inlet 152a and an oxygen-containing gas outlet 152b. The serpentine oxygen-containing gas channel 152c is formed by partition plates 152d provided alternately in a zigzag pattern in the first channel member 152.

The second channel member 154 includes a serpentine combustion gas channel 154c extending in a serpentine pattern between a combustion gas inlet 154a and a combustion gas outlet 154b. The serpentine combustion gas channel 154c is formed by partition plates 154d provided alternately in a zigzag pattern in the second channel member 154. The combustion gas in the serpentine combustion gas channel 154c and the oxygen-containing gas in the serpentine oxygen-containing gas channel 152c flow symmetrically with each other.

In the fourth embodiment, in the thermoelectric converter 150, the combustion gas and the oxygen-containing gas flow symmetrically with each other. The thermoelectric converter 150 includes the plurality of thermoelectric conversion elements 156 having a predetermined thermoelectric conversion temperature. In the structure, in the thermoelectric converter 150, the thermoelectric conversion elements 156 having the optimum thermoelectric conversion temperature can be used depending on the expected temperature difference. Thus, efficient thermoelectric conversion can be performed reliably.

Although certain embodiments of the present invention have been shown and described in detail, it should be understood that various changes and modifications may be made to the embodiments without departing from the scope of the invention as set forth in the appended claims.

The invention claimed is:

1. A fuel cell module comprising:
    a fuel cell stack for generating electricity by electrochemical reactions of a fuel gas and an oxygen-containing gas;
    a reformer for reforming a mixed gas of water vapor and a raw fuel chiefly containing hydrocarbon to produce the fuel gas, and supplying the fuel gas to the fuel cell stack;
    an evaporator for evaporating water, and supplying water vapor to the reformer;
    a heat exchanger for raising a temperature of the oxygen-containing gas by heat exchange with a combustion gas, and supplying the oxygen-containing gas to the fuel cell stack;
    an exhaust gas combustor for combusting the fuel gas discharged from the fuel cell stack as a fuel exhaust gas and the oxygen-containing gas discharged from the fuel cell stack as an oxygen-containing exhaust gas to produce a first portion of the combustion gas; and
    a start-up combustor for combusting the raw fuel and the oxygen-containing gas to produce a second portion of the combustion gas,
    wherein the fuel cell module includes a thermoelectric converter for performing thermoelectric conversion based on a temperature difference between the combustion gas and the oxygen-containing gas;

further comprising a combustion gas channel for supplying the combustion gas successively to the heat exchanger, the reformer, and the evaporator; and an oxygen-containing gas channel for supplying the oxygen-containing gas from the heat exchanger to the fuel cell stack, wherein the thermoelectric converter is provided downstream of the evaporator in the combustion gas channel, and upstream of the heat exchanger in the oxygen-containing gas channel.

2. The fuel cell module according to claim 1, wherein the oxygen-containing gas channel includes a cooling channel for cooling the start-up combustor at a position upstream of the heat exchanger; and the thermoelectric converter is provided upstream of the cooling channel.

3. The fuel cell module according to claim 2, wherein another thermoelectric converter is provided in the start-up combustor.

4. The fuel cell module according to claim 1, wherein the combustion gas and the oxygen-containing gas flow in the thermoelectric converter in parallel to each other, and the thermoelectric converter includes a plurality of thermoelectric conversion elements each having a different thermoelectric conversion temperature.

5. The fuel cell module according to claim 1, wherein the combustion gas and the oxygen-containing gas flow in the thermoelectric converter in a counterflow manner, and the thermoelectric converter includes a plurality of thermoelectric conversion elements having a predetermined thermoelectric conversion temperature.

6. The fuel cell module according to claim 1, wherein the combustion gas and the oxygen-containing gas flow in the thermoelectric converter in a manner that the combustion gas and the oxygen-containing gas intersect with each other, and the thermoelectric converter includes a plurality of thermoelectric conversion elements having a predetermined thermoelectric conversion temperature.

7. The fuel cell module according to claim 1, wherein the combustion gas and the oxygen-containing gas flow in the thermoelectric converter symmetrically with each other, and the thermoelectric converter includes a plurality of thermoelectric conversion elements having a predetermined thermoelectric conversion temperature.

8. The fuel cell module according to claim 1, wherein the oxygen-containing gas channel is branched into a first oxygen-containing gas supply channel for supplying the oxygen-containing gas to the heat exchanger and a second oxygen-containing gas supply channel for supplying the oxygen-containing gas to the start-up combustor; and an oxygen-containing gas regulator valve for regulating a distribution amount of the oxygen-containing gas is provided at a branch portion.

9. The fuel cell module according to claim 1, further comprising a raw fuel channel for supplying the raw fuel to the reformer, wherein a raw fuel branch channel for supplying the raw fuel to the start-up combustor is branched from the raw fuel channel; and a raw fuel regulator valve for regulating a distribution amount of the raw fuel is provided at the branch portion.

10. The fuel cell module according to claim 1, wherein the exhaust gas combustor is provided integrally in the heat exchanger; and the start-up combustor is provided adjacent to one end of the heat exchanger, and the reformer is provided adjacent to the other end of the heat exchanger.

11. The fuel cell module according to claim 1, wherein the fuel cell module is a solid oxide fuel cell module.

* * * * *